(12) United States Patent
Hiroshima et al.

(10) Patent No.: US 7,078,275 B2
(45) Date of Patent: Jul. 18, 2006

(54) SEMICONDUCTOR DEVICE AND MANUFACTURING METHOD FOR SAME

(75) Inventors: Yasushi Hiroshima, Suwa (JP); Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 137 days.

(21) Appl. No.: 10/411,145

(22) Filed: Apr. 11, 2003

(65) Prior Publication Data

US 2004/0079944 A1    Apr. 29, 2004

(30) Foreign Application Priority Data

Apr. 16, 2002 (JP) .............................. 2002-113240
Apr. 9, 2003 (JP) .............................. 2003-105730

(51) Int. Cl.
*H01L 21/00* (2006.01)

(52) U.S. Cl. ...................... 438/150; 438/149; 438/151; 438/152; 257/66; 257/67; 257/68

(58) Field of Classification Search ............ 257/66–72, 257/393, 903, 581; 438/149–151, 152–156, 438/157, 166, 162–163
See application file for complete search history.

(56) References Cited

U.S. PATENT DOCUMENTS

| 4,933,298 | A | * | 6/1990 | Hasegawa | 438/150 |
| 5,531,182 | A | * | 7/1996 | Yonehara | 117/7 |
| 5,814,835 | A | * | 9/1998 | Makita et al. | 257/64 |
| 5,858,823 | A | * | 1/1999 | Yamazaki et al. | 438/166 |
| 5,879,974 | A | * | 3/1999 | Yamazaki | 438/162 |
| 5,893,730 | A | * | 4/1999 | Yamazaki et al. | 438/166 |
| 6,063,654 | A | * | 5/2000 | Ohtani | 438/166 |
| 6,288,412 | B1 | * | 9/2001 | Hamada et al. | 257/59 |
| 6,335,540 | B1 | * | 1/2002 | Zhang | 257/53 |

FOREIGN PATENT DOCUMENTS

JP          A 11-87243          3/1999

OTHER PUBLICATIONS

Ryoichi Ishihara et al., "Advanced Excimer-Laser Crystallization Techniques of Si Thin-Film for Location Control of Large Grain on Glass", 2001, Proc. of SPIE vol. 4295, pp. 14-23.*

(Continued)

*Primary Examiner*—Donghee Kang
(74) *Attorney, Agent, or Firm*—Oliff & Berridge, PLC

(57) ABSTRACT

An object is to provide a semiconductor device manufacturing method which makes possible a thin film transistor which is little affected by crystal grain boundaries, even when the channel width of the thin film transistor is made larger than the crystal grains of the semiconductor material. To this end, a thin film transistor of this invention comprises a gate electrode 22, source region 24, drain region 25, and channel formation region 26. The silicon film used in forming the active region comprises a plurality of substantially single-crystal silicon crystal grains, and regions including crystal grain boundaries which exist in the longitudinal direction of the channel formation region 26 (the direction L in the drawings) are removed. By this means, crystal grain boundaries are prevented from being included in each channel formation region 26, and the effective channel width can be increased.

9 Claims, 9 Drawing Sheets

OTHER PUBLICATIONS

Single Crystal Thin Film Transistors, IBM Technical Disclosure Bulletin, pp. 257-258, Aug. 1993.

Ishihara et al., Advanced Excimer-Laser Crystallization Techniques of Si Thin-Film for Location Control of Large Grain on Glass, Delft Institute on Microelectronics and Submicrontechnology (DIMES), Delft University of Technology, Delft, The Netherlands, Proceedings of SPIE, vol. 4295, pp. 14-23, 2001.

* cited by examiner

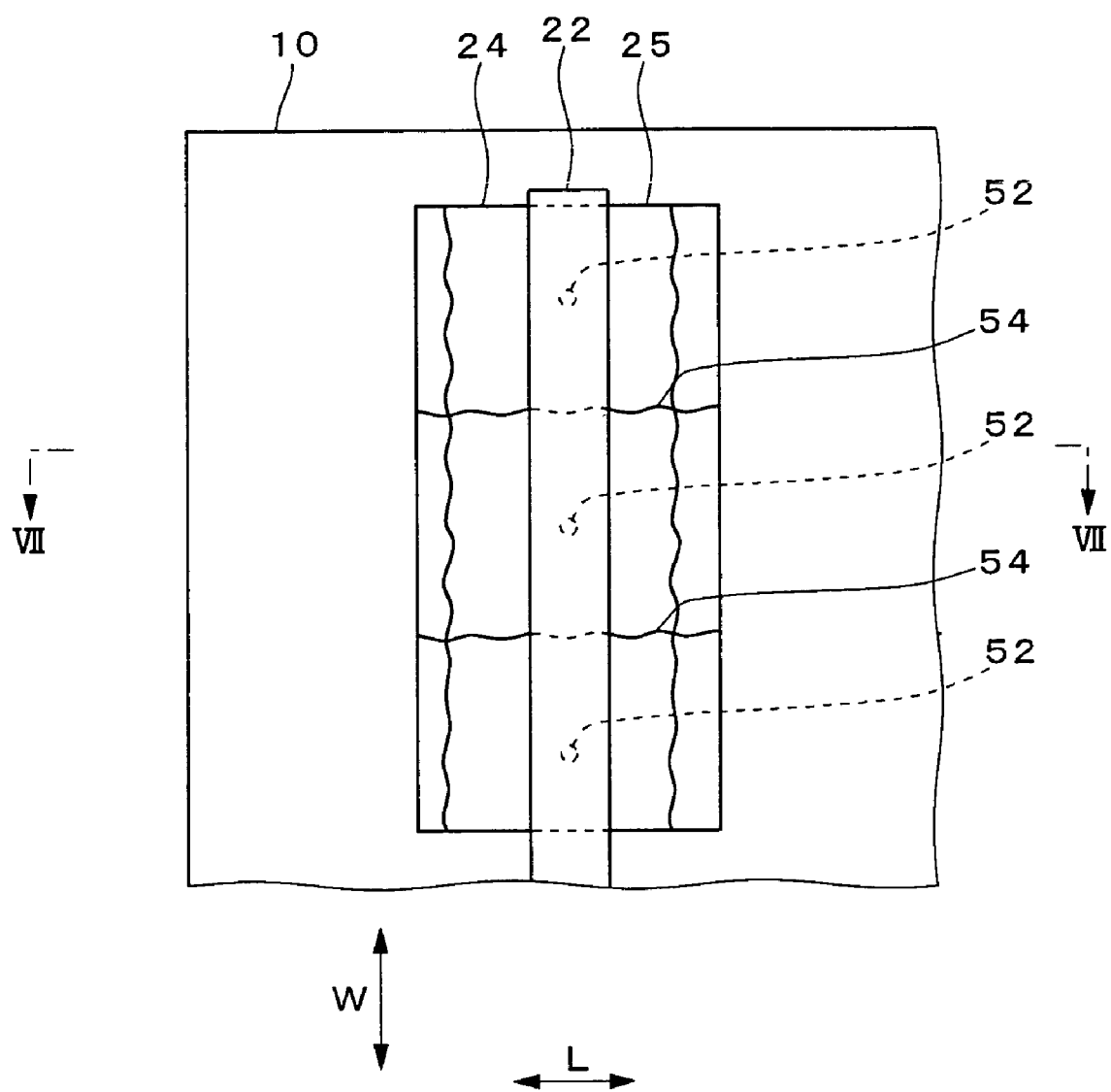

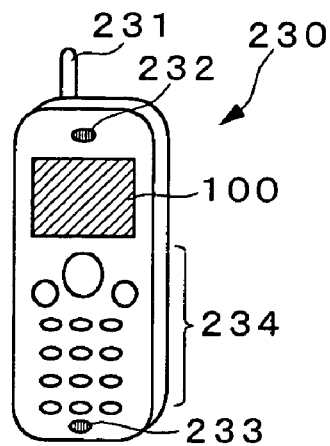
FIG.9A
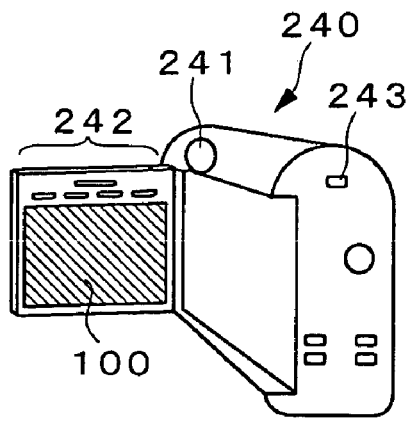
FIG.9B
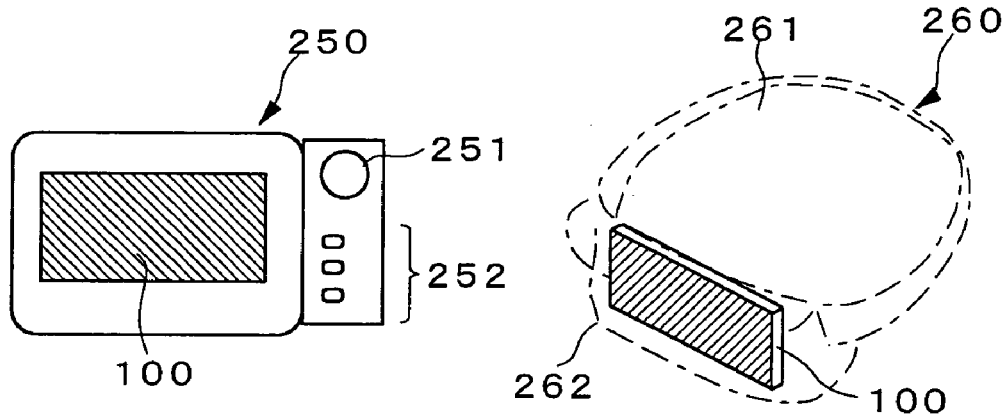
FIG.9C
FIG.9D
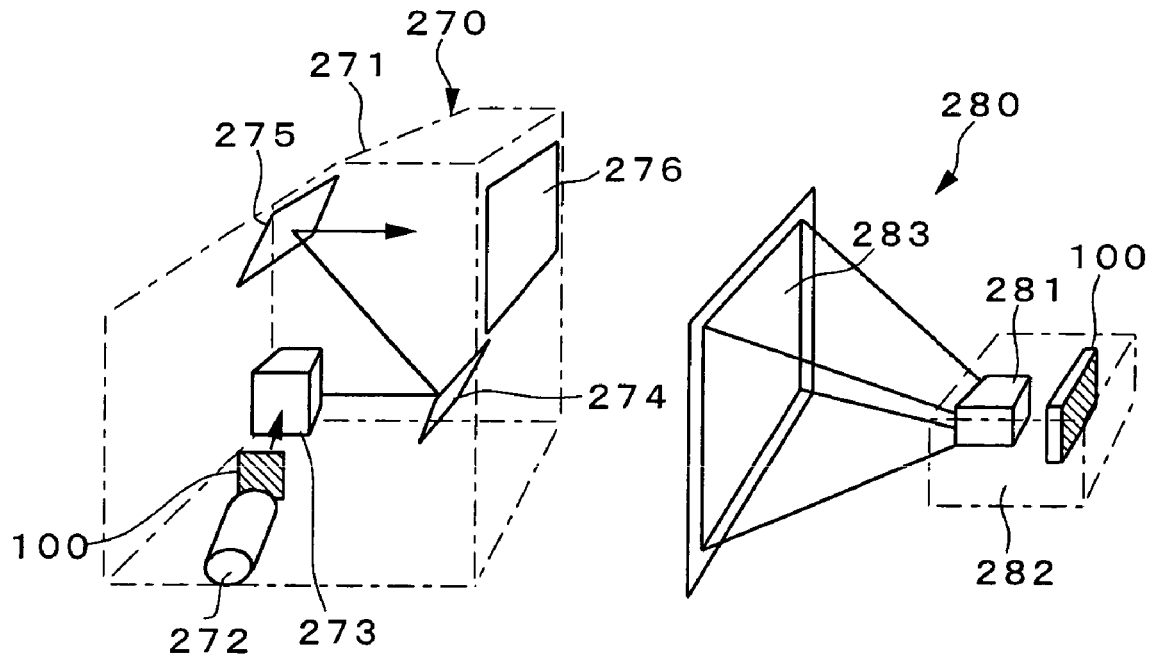
FIG.9E
FIG.9F

SEMICONDUCTOR DEVICE AND MANUFACTURING METHOD FOR SAME

BACKGROUND OF THE INVENTION

1. Field of the Invention

This invention relates to a method of manufacture of a semiconductor device, and to a semiconductor device, electro-optical device, integrated circuit, and electronic equipment manufactured by this method.

2. Description of the Related Art

In an electro-optical device, such as for example a liquid crystal display device or an organic EL (electroluminescence) display device, pixel switching and similar is performed using thin film circuits which are configured comprising thin film transistors as semiconductor elements. In a thin film transistor of the prior art, a channel formation region or other active region is formed using amorphous silicon film. Thin film transistors have also been employed in which polycrystalline silicon film is used to form an active region. By using polycrystalline silicon film, the mobility and other electrical characteristics are improved compared with elements using amorphous silicon film, and the performance of the thin film transistor can be enhanced.

In order to further improve the performance of thin film transistors, technology has been studied in which a semiconductor film comprising large crystal grains is formed, such that crystal grain boundaries do not intrude into the channel formation region of the thin film transistor. For example, a technique has been proposed in which, by forming a minute hole (depression) in a substrate, and using this hole as a starting-point for crystal growth to crystallize a semiconductor film, silicon crystal grains with large grain diameters are formed. Such a technique is described in, for example, Japanese Patent Laid-open No. 11-87243, in the reference "Single Crystal Thin Film Transistors", IBM Technical Disclosure Bulletin, August 1993, pp. 257–258, and in the reference "Advanced Excimer-Laser Crystallization Techniques of Si Thin-Film for Location Control of Large Grain on Glass", R. Ishihara et al, proc. SPIE 2001, vol. 4295, pp. 14–23. By forming a thin film transistor employing silicon film with large crystal grain diameters formed using this technique, it is possible to prevent crystal grain boundaries from intruding into a formation region (in particular, the channel formation region) of one thin film transistor. By this means, thin film transistors can be realized with excellent mobility and other electrical characteristics.

When forming a thin film transistor for use in applications where comparatively large currents are passed, the width of the channel formation region (channel width) is set to be large when forming the thin film transistor. For example, in a buffer circuit to output a signal, and particularly in a buffer circuit to select a scan line in a liquid crystal display device or organic EL device, thin film transistors with large channel widths are used. When setting large channel widths in this way also, it is desirable that the thin film transistor be formed such that crystal grain boundaries are not included in the channel formation region.

However, the crystal grain diameters of silicon films which can be formed using the techniques described in the above references are several microns approximately, so that when silicon film is formed on a substrate, crystal grain boundaries exist in intervals of at least several microns approximately in the silicon film. Consequently when attempting to form a thin film transistor in which the channel width is set to be larger than this, crystal grain, boundaries existing in the channel longitudinal direction traverse the channel formation region, so that crystal grain boundaries are included in the channel formation region, and so impede efforts to further improve the characteristics of the thin film transistor.

Hence this invention has as an object the provision of a semiconductor device manufacturing method enabling the fabrication of a thin film transistor which is little affected by crystal grain boundaries, even when the channel width of the thin film transistor is made larger than the crystal train boundaries of the semiconductor material.

Also, this invention has as an object the provision of a semiconductor device enabling a thin film transistor with comparatively large output current, and with satisfactory charge mobility and other characteristics.

SUMMARY OF THE INVENTION

In order to achieve the above objects, this invention relates to a method of manufacture of a semiconductor device in which a semiconductor film is formed on substrate and the semiconductor film is used to form a thin film transistor, and comprises: a starting-point portion formation process for forming a plurality of starting-point portions, that become starting points for crystallization of a semiconductor film, on the substrate; a semiconductor film formation process for forming a semiconductor film on the substrate on which the starting-point portions have been formed; a heat treatment process for heat treating the semiconductor film and forming a plurality of substantially single-crystal grains, each substantially centered on one of the plurality of starting-point portions; a patterning process for patterning the semiconductor film to form transistor regions which are to become source and drain regions and a channel formation region; and an element formation process for forming a gate insulating film and gate electrode or the transistor regions to form a thin film transistor; and wherein, in the patterning process, the semiconductor film is removed in a region comprising boundaries between the substantially single-crystal grains which exist in the longitudinal direction of the channel formation region.

When patterning semiconductor film, semiconductor film is removed in regions comprising boundaries, existing in the longitudinal direction of the channel formation region (channel longitudinal direction), between substantially single-crystal grains, that is, comprising crystal grain boundaries; hence it is possible to form a channel formation region with a large effective channel width, while avoiding the inclusion of crystal grain boundaries in the channel formation region. By this means, even when the channel width is made large, a thin film transistor can be obtained in which the effect of crystal grain boundaries is small and which has satisfactory characteristics.

In this Specification, "substantially single-crystal" refers not only to the case of a single crystal grain, but also to a state close to this; that is, cases in which a plurality of crystals are combined but in small numbers, and with properties which, from the standpoint of semiconductor film properties, are substantially equivalent to the properties of a semiconductor film formed from a single crystal. In particular, the grain boundaries in the substantially single-crystal grain are not random grain boundaries, but are coincidence site lattice grain boundaries such as $\Sigma 3$, $\Sigma 9$, $\Sigma 27$, etc.

It is preferable that in the patterning process, semiconductor film also be removed from at least either the regions of substantially single-crystal grain starting-point portions and regions in the vicinity thereof. In a crystal grain which is formed substantially centered on a starting-point portion, there may be crystal defects and crystal disordering in the starting-point portion and vicinity thereof. Hence by removing the semiconductor film in the region of a substantially single-crystal grain starting-point portion and the vicinity thereof, the inclusion of semiconductor film of poor crystallinity in the channel formation region can be avoided, and the characteristics of the thin film transistor can be improved. A similar advantageous result can be anticipated by removing either a starting-point region or the vicinity of the starting-point region, or by removing a starting-point portion and one of the regions in proximity to the starting-point portion.

It is preferable that the above-described starting-point portions be depressions formed in the substrate. By this means, portions which are to become starting-points for crystallization can easily be formed.

It is preferable that the heat treatment in the above-described heat treatment process be performed under conditions such that a portion of the semiconductor film in the unmelted state remains in the depression, and that the other portion is melted. By this means, crystallization of the semiconductor film after heat treatment starts from the material in the depression in the unmelted state, and in particular from the vicinity of the bottom, and proceeds to the periphery. At this time, by appropriately selecting the depression dimensions, only a single crystal grain reaches the upper portion (aperture portion) of the depression. Then, in the melted portion of the semiconductor film, crystallization occurs with the single crystal grain reaching to the upper portion of the depression as a nucleus, so that substantially single-crystal semiconductor film (substantially a single crystal grain) is formed in the range substantially centered on the depression.

It is preferable that heat treatment be performed by laser irradiation. By using a laser, heat treatment can be performed efficiently. As the laser used, an excimer laser or other gas laser, a YAG laser or other solid-state laser, or various other kinds are conceivable.

It is preferable that the semiconductor film formed on the substrate be an amorphous or a polycrystalline (poly-crystal) silicon film. By this means, a substantially single-crystal silicon crystal grain can be formed in the range substantially centered on the starting-point portion, and using this good-quality silicon crystal grain, a thin film transistor can be formed.

Further, this invention relates to a method of manufacture of a semiconductor in which a semiconductor film is formed on substrate and the semiconductor film is used to form a thin film transistor, and the method comprises: a starting-point portion formation process for forming a plurality of starting-point portions., that become starting points for crystallization of a semiconductor film, on the substrate; a semiconductor film formation process for forming a semiconductor film on the substrate on which the starting-point portions have been formed; a heat treatment process for heat treating the semiconductor film and forming a plurality of substantially single-crystal grains, each substantially centered on one of the plurality of starting-point portions; a patterning process for patterning the semiconductor film to form transistor regions which are to become source and drain regions and a channel formation region; and an element formation process for forming a gate insulating film and gate electrode on the transistor regions to form a thin film transistor; and wherein, in the patterning process, the semiconductor film is removed in a region comprising at least either the starting-point regions or the vicinity thereof of the substantially single-crystal grains.

Often, when crystal growth proceeds toward the periphery from the vicinity of a starting-point portion, crystal grain boundaries appear or the crystallinity of the semiconductor film is otherwise degraded in this region. Hence by removing the semiconductor film in such a region, it is possible to form a channel formation region having a large effective channel width, while avoiding the effects of crystal grain boundaries. In this way, even when the channel width is made large the effect of crystal grain boundaries is small, and a thin film transistor with satisfactory characteristics can be obtained.

Further, this invention relates to a method of manufacture of a semiconductor device in which a semiconductor film is formed on substrate and the semiconductor film is used to form a thin film transistor, and the method comprises: a starting-point portion formation process for forming a plurality of starting-point portions, that become starting points for crystallization of semiconductor film, on the substrate a semiconductor film formation process for forming a semiconductor film on the substrate on which the starting-point portions have been formed; a heat treatment process for heat treating the semiconductor film and forming a plurality of substantially single-crystal grains, each substantially centered on one of the plurality of starting-point portions; a patterning process for patterning the semiconductor film to form transistor regions which are to become source and drain regions and a channel formation region; and an element formation process for forming a gate insulating film and gate electrode on the transistor regions to form a thin film transistor; and wherein, in the element formation process, the gate electrode is formed such that the direction of extension of the boundaries between the substantially single-crystal grains and the longitudinal direction of the channel formation region are substantially parallel.

In this way, by positioning the transistor region and gate electrode such that at least the channel formation region longitudinal direction (channel longitudinal direction) is substantially parallel to the direction of extension of crystal grain boundaries contained in the channel formation region, the direction of flow of carriers (current direction) in the channel formation region is substantially parallel to the direction of extension of crystal grain boundaries, so that carriers (electrons or holes) are not easily affected by crystal grain boundaries. Hence it is possible to form a channel formation region with a large effective channel width, while avoiding the effect of crystal grain boundaries. By this means, a thin film transistor can be obtained which is affected little by crystal grain boundaries and which has satisfactory characteristics, even when the channel width is made large.

It is preferable that in the above patterning process, the semiconductor film be removed in at least either the regions of the starting-point portions of substantially single-crystal grains or regions in the vicinity thereof. By this means, the characteristics of the thin film transistor can be further improved.

Further, this invention concerns a semiconductor device, configured to comprise a thin film transistor formed using semiconductor film formed on substrate, wherein the semiconductor film is formed comprising a plurality of substantially single-crystal grains formed with a plurality of starting-point portions, provided on the substrate, as starting points, and in which the semiconductor film of the channel formation region of the thin film transistor is patterned so as not to contain boundary regions between substantially single-crystal grains, existing in the longitudinal direction of the channel formation region (channel longitudinal direction).

Because the channel formation region is formed using semiconductor film patterned so as not to contain boundaries between substantially single-crystal grains, that is crystal grain boundaries, which exist in the channel longitudinal direction, it is possible to form a channel formation region with a large effective channel width, while avoiding the inclusion of crystal grain boundaries in the channel formation region. By this means, even if the channel width is made large, it is possible to avoid insofar as possible the effects of crystal grain boundaries, so that a thin film transistor can be obtained with a comparatively large output current, and with good charge mobility and other characteristics.

It is preferable that the semiconductor film of the channel formation region be patterned so as not to include at least either the starting-point portions or regions in the vicinity thereof. As described above, in a crystal grain formed to be substantially centered on a starting-point portion, there may be crystal defects and crystal disordering in the starting-point portion and vicinity thereof. Hence by using semiconductor film patterned so as not to contain the region of the starting-point portion and vicinity thereof, the inclusion in the channel formation region of semiconductor film with degraded crystallinity can be avoided, and the characteristics of the thin film transistor can be further improved.

Further, this invention relates to a semiconductor device, comprising a thin film transistor formed using a semiconductor film formed on substrate, wherein the semiconductor film is formed comprising a plurality of substantially single-crystal grains formed with a plurality of starting-point portions, provided on the substrate, as starting points, and in which the semiconductor film of the channel formation region of the thin film transistor is patterned so as not to contain at least either regions of starting-point portions or regions in the vicinity thereof. In this configuration also, the effect of crystal grain boundaries can be avoided insofar as possible, and a thin film transistor can be obtained with comparatively large output current and with good charge mobility and other characteristics.

Further, this invention concerns a semiconductor device, comprising a thin film transistor formed using semiconductor film formed on substrate, wherein the semiconductor film is formed comprising a plurality of substantially single-crystal grains formed with a plurality of starting-point portions, provided on the substrate, as starting points, and in which the semiconductor film and the thin film transistor gate electrode are positioned such that the direction of extension of boundaries between substantially single-crystal grains and the longitudinal direction of the channel formation region are substantially parallel. By means of this configuration, the effects of crystal grain boundaries can be avoided insofar as possible, and a thin film transistor can be obtained with comparatively large output current and with good charge mobility and other characteristics.

It is preferable that the semiconductor film of the channel formation region be patterned so as not to include at least either the regions of starting-point portions or regions in the vicinity thereof. By this means, further improvement in the performance of the thin film transistor is possible.

It is preferable that the starting-point portions be depressions formed in the substrate, and that the semiconductor film be formed by crystallization resulting from heat treatment performed such that an unmelted portion of the semiconductor film remains within the depressions, and the other portions are melted. By this means, a thin film transistor can be formed using a substantially single-crystal semiconductor film (substantially single-crystal grain) formed in a range substantially centered on a depression.

It is preferable that the semiconductor film be amorphous or polycrystalline silicon film subjected to heat treatment. By this means, good-quality silicon film can be formed, and a thin film transistor can be formed using this good-quality silicon film.

It is preferable that a liquid crystal display device, organic electroluminescence display device, or other electro-optical device be formed using the above-described semiconductor device (thin film transistor). Here "electro-optical device" refers to devices in general comprising a semiconductor device of this invention, and further comprising an electro-optical element which emits light or which causes changes to the state of light from outside through electrical action, and includes both devices which emit light and devices which control the transmission of light from outside. Electro-optical elements include, for example, liquid crystal elements, electrophoresis elements having a disperse medium in which are dispersed electrophoretic particles, EL (electroluminescence) elements, and electron emission elements which cause light emission by irradiating a luminescent plate with electrons emitted by application of an electric field, comprised by an active-matrix type display device or similar. By this means, an electro-optical device with excellent display quality can be configured.

It is further preferable that an integrated circuit be formed using the above-described semiconductor device (thin film transistor). Here "integrated circuit" means a circuit wired with the semiconductor device and related wiring and similar integrated so as to perform definite functions; an example is a buffer circuit which, in the above-described electro-optical devices, drives pixel circuitry. By using the semiconductor device of this invention, large currents can be accommodated, and an integrated circuit which can be formed on glass substrate or similar can be obtained. Further, by forming an integrated circuit of this invention on a substrate, a circuit substrate with excellent characteristics can be obtained. Here "circuit substrate" means a substrate having a plurality of semiconductor elements on one or both surfaces, and having wiring and similar for interconnection of semiconductor elements as necessary; an example is an active matrix substrate used in organic EL display devices and other display devices.

This invention also concerns electronic equipment configured to comprise the above-described electro-optical device and/or integrated circuit. Here "electronic equipment" means general equipment which performs definite functions, and comprising, for example, a display device (electro-optical device) and memory or similar. There are no particular limitations on the configuration; examples however include IC cards, portable telephones, camcorders, personal computers, head-mounted displays, rear or front projectors, fax machines with display functions, the viewfinders of digital cameras, portable TV sets, DSP devices, PDAs, electronic organizers, electro-optical announcement boards, and advertisement displays. By using one or both of the above-described electro-optical devices and integrated circuits, high-quality electronic equipment can be fabricated.

BRIEF DESCRIPTION OF THE DRAWINGS

FIG. 6 is a plane view showing another embodiment of a transistor region;

DESCRIPTION OF THE PREFERRED EMBODIMENTS

Figure 1:
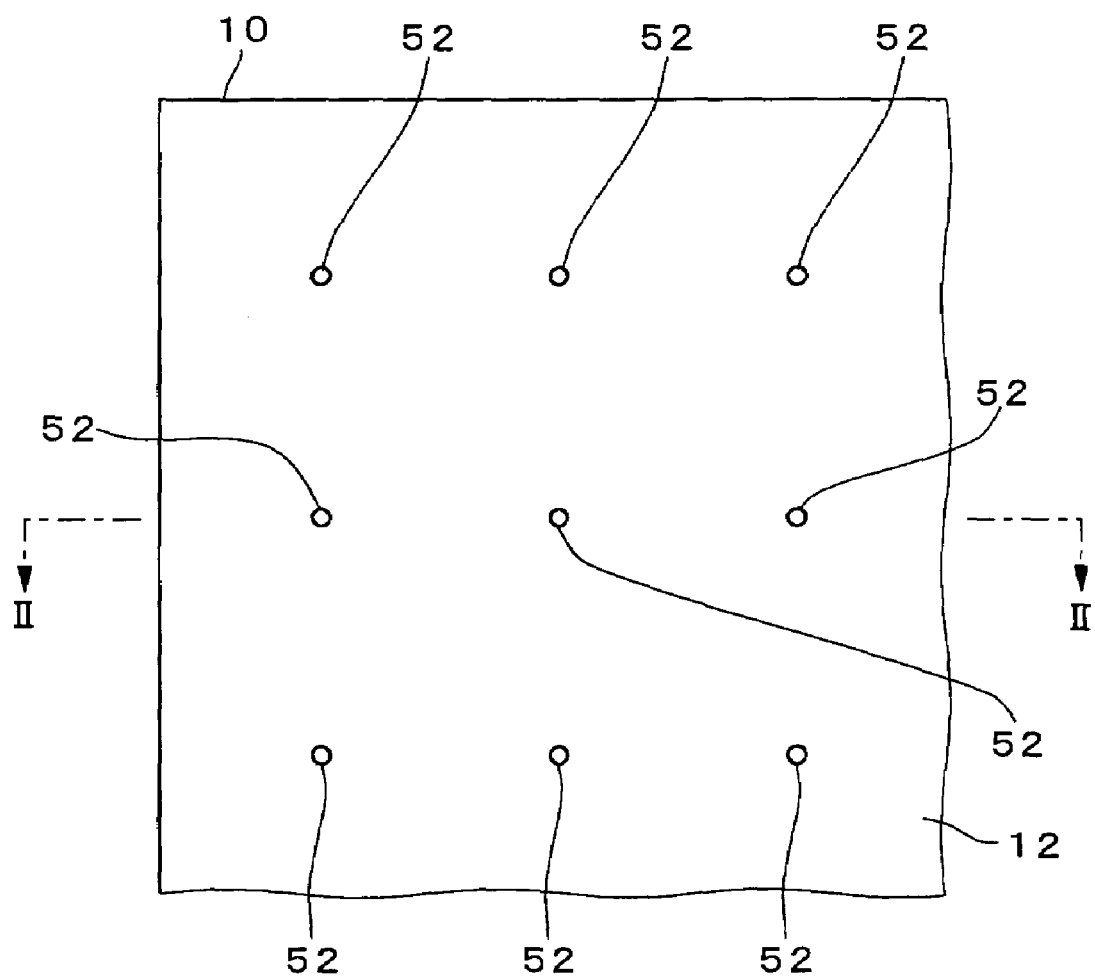
FIG. 1 is an explanatory drawing which explains the process of formation of silicon film.

Below, aspects of this invention are explained, referring to the drawings. The method of manufacture of this aspect comprises (1) a process of forming, on glass substrate, silicon film for use as the active region of a thin film transistor, and (2) a process of forming the thin film transistor using the silicon film thus formed. Below, these processes are explained in detail.

FIG. 1 and FIG. 2 are explanatory drawings which explain the process of formation of the silicon film. FIG. 1 shows a partial plane view of a glass substrate 10 on which the silicon film is formed. FIG. 2 corresponds to the cross-section in the direction II—II shown in FIG. 1.

Figure 2A:
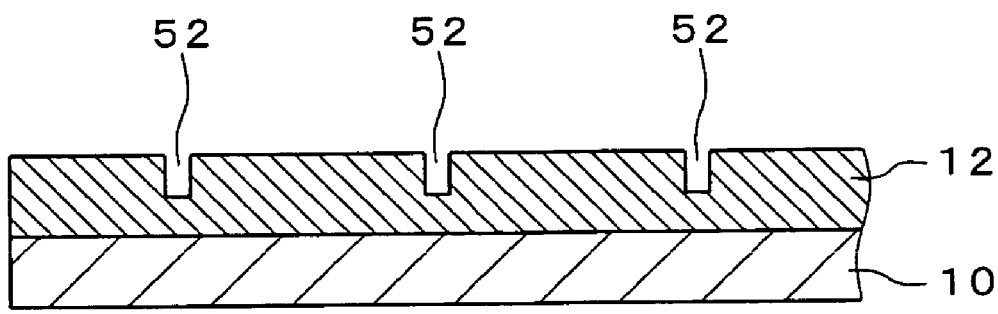
FIG. 2A through FIG. 2D are explanatory drawings which explain processes to form silicon film.

As shown in FIG. 1 and in FIG. 2A, a silicon oxide film 12 is formed as an insulating film on the glass substrate 10. It is appropriate to form the silicon oxide film 12 by, for example, plasma chemical vapor deposition (PECVD), low-pressure chemical vapor deposition (LPCVD), sputtering, or some other film deposition method. The substrate is not limited to glass or another insulating material, and for example stainless steel or another metal substrate, or silicon or another semiconductor substrate, can be used.

Next, a plurality of depressions 52 (hereafter these depressions are called "grain filters" 52) are formed in the silicon oxide film 12. A grain filter is a hole provided in order to cause the preferential growth of a single crystal nucleus. In this aspect, grain filters 52 are formed so as to be arranged regularly, positioned at appropriate intervals, as shown in FIG. 1. It is appropriate to form these grain filters 52 in a cylindrical shape with, for example, a diameter of approximately 50 nm or greater and 150 nm or smaller, to a height of approximately 750 nm. The grain filters 52 may also be in a shape other than cylindrical (for example, a square-pillar shape).

The grain filters 52 can be formed by, for example, exposing and developing photoresist applied to the silicon oxide film using a positioning mask for the grain filters 52, to form, on the silicon oxide film 12, a photoresist film (not shown) having aperture portions which expose the positions of formation of grain filters 52, then performing reactive ion etching using this photoresist film as an etching mask, and thereafter removing the photoresist mask on the silicon oxide film 12. When forming smaller-diameter grain filters 52, after removing the photoresist film, PECVD, LPCVD, or another method can be used to deposit silicon oxide film, in order to narrow the hole diameter of the depressions. When using the PECVD method in particular, use of TEOS (tetraethyl orthosilicate) as the raw material is appropriate for formation of narrower grain filters 52.

Figure 2B:
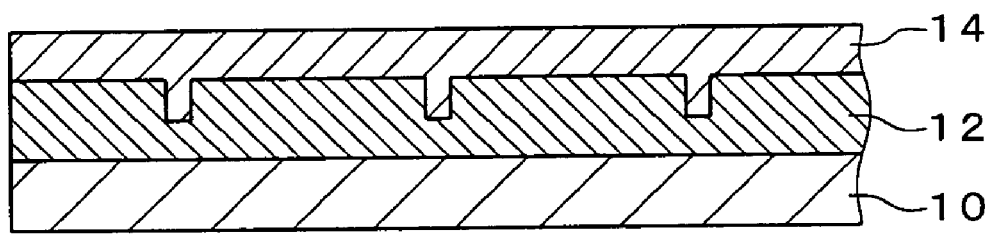

Next, an amorphous silicon film 14 is formed on the silicon oxide film 12 and within the grain filters 52 by LPCVD, PECVD, or anther film fabrication method, as shown in FIG. 2B. It is appropriate to form this amorphous silicon film 14 to a film thickness of approximately 50 nm to 300 nm. In place of an amorphous silicon film 14, a polycrystalline silicon film may be formed. When the silicon film 14 is formed by the LPCVD or PECVD method, the hydrogen content of the silicon film thus formed may be comparatively high. In such a case, in order that ablation of the silicon film 14 does not occur during the laser irradiation described below, heat treatment may be performed in order to lower-the hydrogen content in the silicon film 14 (preferably to 1% or lower).

Figure 2C:
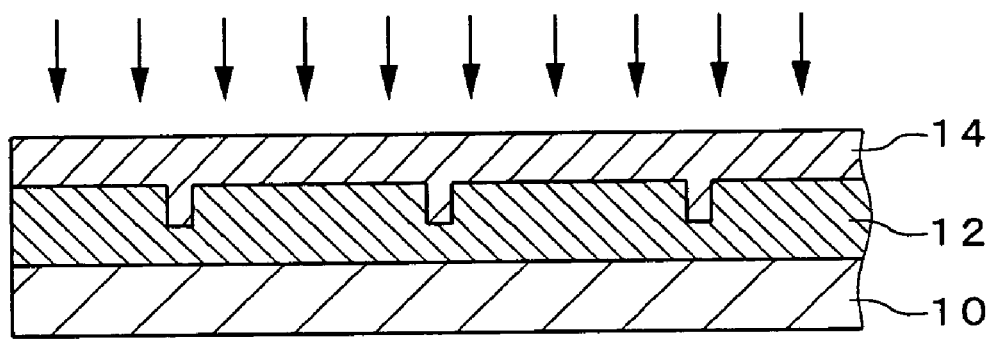

Next, as shown in FIG. 2C, laser irradiation of the silicon film 14 is performed. It is appropriate to perform this laser irradiation using, for example, an XeCl pulsed excimer laser at a wavelength of 308 nm and with a pulse width of 20 ns to 30 ns, or using an XeCl excimer laser with a pulse width of approximately 200 ns, such that the energy density is approximately 0.4 J/cm$^2$ to 1.5 J/cm$^2$. By performing laser irradiation under these conditions, nearly all the irradiated laser light is absorbed near the surface of the silicon film 14. This is because the absorption coefficient of amorphous silicon at the XeCl pulsed excimer laser wavelength (308 nm) is a comparatively large 0.139 nm$^{-1}$.

In laser irradiation of the glass substrate 10, the irradiation method can be selected as appropriate according to the capacity of the device used for laser irradiation. For example, when the area which can be irradiated is small, a method may be used in which each grain filter 52 and the vicinity thereof is irradiated selectively. When the area which can be irradiated is comparatively large, a method is conceivable in which ranges containing a number of grain filters 52 can be selected in succession and laser irradiation of these ranges is repeated a plurality of times. And in cases where the device capacity is extremely high, a single laser irradiation may be used to perform laser irradiation of a range which includes all the grain filters 52.

By appropriately selecting the conditions for the above-described laser irradiation, a portion of the silicon film 14 remains in an unmelted state at the bottoms of each of the grain filters 52, and the other portions are substantially in a completely molten state. By this means, silicon crystal growth after the laser irradiation begins first in the vicinity of the bottom of the grain filters 52, and proceeds to near the surface of the silicon film 14, that is, to the portions which are substantially in a completely molten state.

Figure 2D:
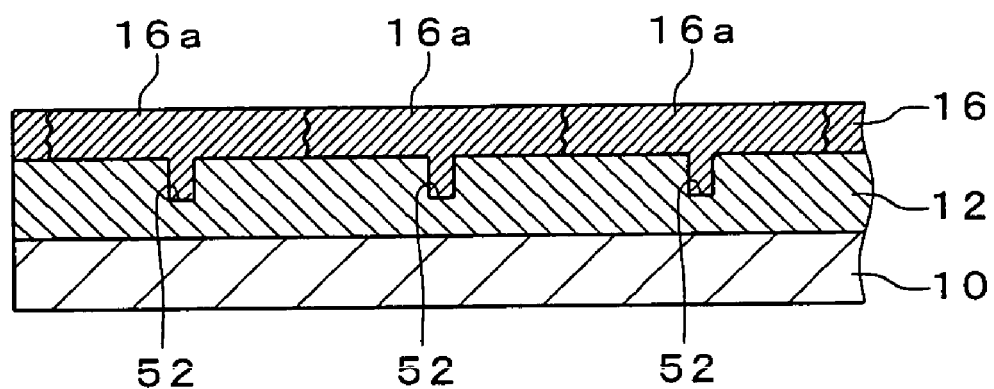

A number of crystal grains may appear at the bottom of a grain filter 52. In this case, by making the cross-sectional dimensions of the grain filter 52 (in this aspect, the diameter of a circle) equal to or somewhat smaller than a single crystal grain, only a single crystal grain reaches the top portion (aperture portion) of the grain filter 52. As a result, the single crystal grain which reaches the top portion of the grain filter 52 acts as a nucleus in the crystal growth within the portion of the silicon film 14 which is substantially in a completely molten state, so that as shown in FIG. 2D, a silicon film 16 is formed in which large-diameter silicon crystal grains 16a which are substantially in a single-crystal state, and are centered on a grain filter 52, are arranged regularly.

During melting and crystallization by the above-described laser irradiation, it is desirable that the glass substrate 10 also be heated. For example, a stage on which is placed the glass substrate 10 may be used to perform heat treatment such that the temperature of the glass substrate 10 is approximately 200° C. to 400° C. In this way, by combining laser irradiation and substrate heating, the crystal grain diameters of each of the silicon crystal grains 16a can be made larger still. By adding substrate heating, although results depend on other formation conditions, the diameters of the silicon crystal grains 16a can be made approximately 1.5 to 2 times larger than when substrate heating is not performed. Further, by adding substrate heating, the progress of crystallization can be made gradual, with the advantage that the crystallinity of the silicon crystal grains 16a is improved.

Figure 3:
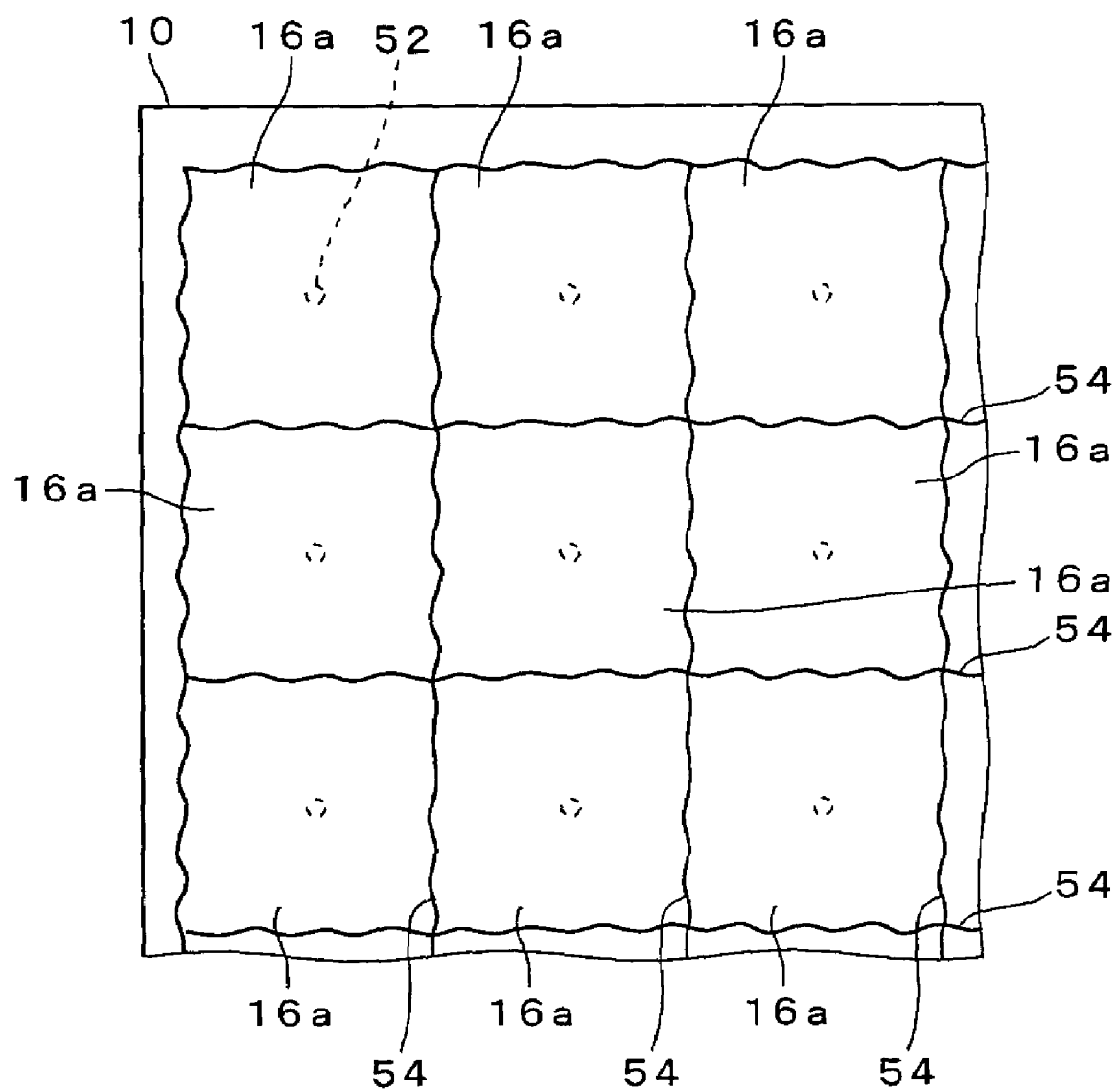
FIG. 3 is a plane view showing silicon film formed on glass substrate.

FIG. 3 is a plane view showing a silicon film 16 formed on the glass substrate 10. As shown in the drawing, each of the silicon crystal grains 16a is formed in a range which is substantially centered on a grain filter 52. Crystal grain boundaries 54 appear in positions at which the peripheral portions of each of the silicon crystal grains 16a make contact. Using such a silicon film 16 in which silicon crystal grains 16a are arranged regularly, the thin film transistor described below, with comparatively large area, is formed.

Next, the structure of a thin film transistor formed using the above-described silicon film 16 is explained. At present, the crystal grain diameters of silicon crystal grains 16a obtained by using grain filters 52 as starting points for crystallization is approximately 5 μm; it is difficult to form a channel formation region with a width greater than this crystal grain diameter so as not to contain crystal grain boundaries 54. Hence in this aspect, as explained below, a thin film transistor is formed over a range which spans a plurality of silicon crystal grains 16a, and at this time, the shape of the transistor regions which are to become the source region, drain region, and channel formation region are designed such that crystal grain boundaries 54 are not included in the channel formation region.

Figure 4:
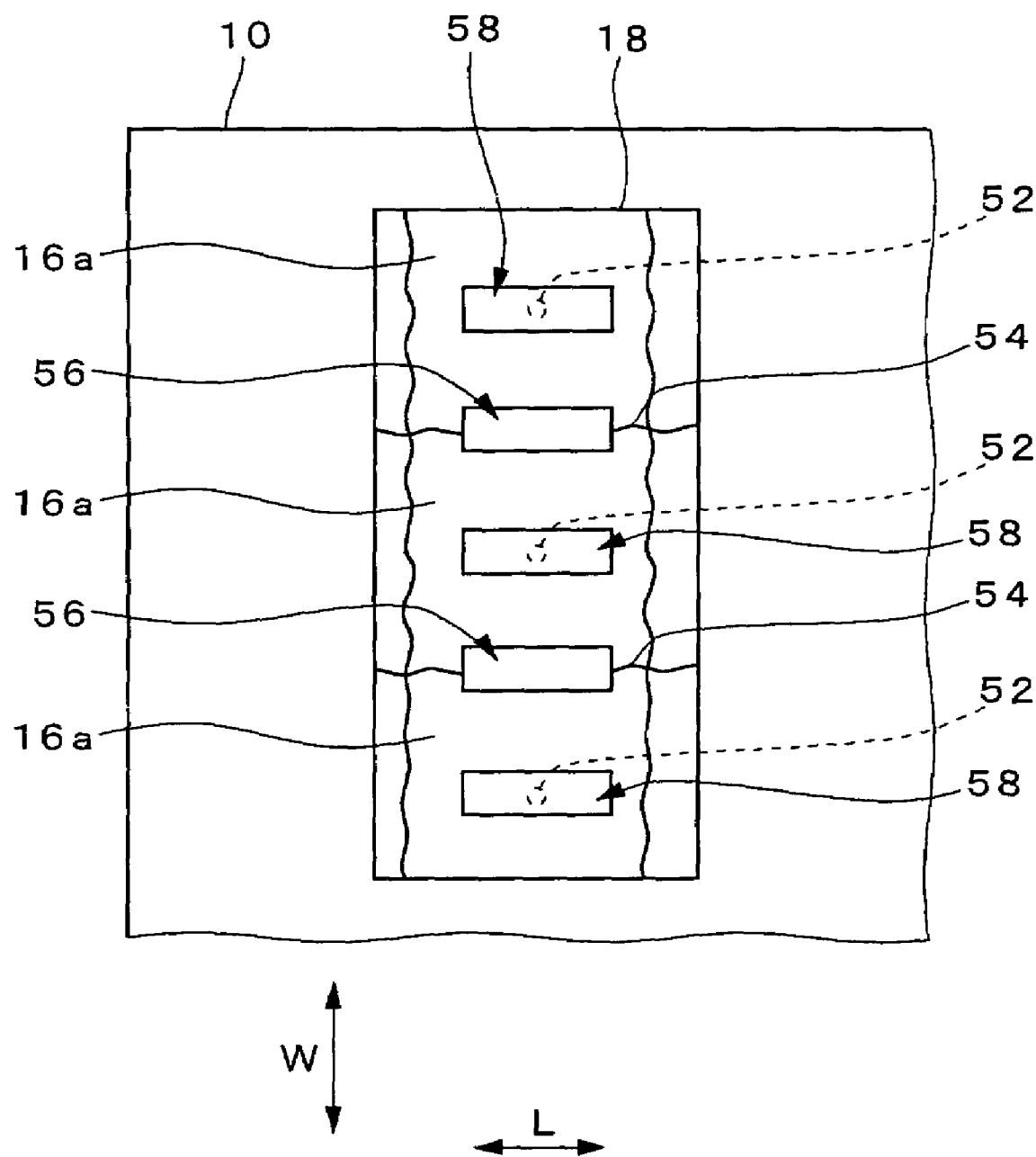
FIG. 4 is an explanatory drawing which explains the shape of a transistor region.

FIG. 4 is an explanatory drawing which explains the shape of a transistor region. As shown in FIG. 4, the transistor region 18 is formed over a range spanning a plurality of silicon crystal grains 16a, and becomes the lower portion of a gate electrode in a later process; semiconductor film is removed in a prescribed range of a boundary region which incorporates crystal grain boundaries 54. Specifically, in the transistor region 18, silicon film is removed in prescribed rectangular-shape ranges 56 containing crystal grain boundaries 54 which exist in the channel longitudinal direction (the L direction in FIG. 4). The prescribed ranges 56 are substantially centered on a crystal grain boundary 54, and have a width (length in the W direction in FIG. 4) of from 500 nm to 1 μm, and the length in the channel longitudinal direction (the L direction in FIG. 4) is set to be larger than the gate electrode formed in a later process.

It is still more preferable that the transistor region 18 be patterned such that silicon film is removed in regions containing grain filters 52 in which disordering of crystallinity readily occurs. Specifically, as shown in FIG. 4. in the transistor region 18 silicon film is removed in the prescribed rectangular ranges 58 containing a grain filter 52. At this time a prescribed range 58 is a region of size at least equal to that of the grain filter, but preferably the width (the length in the W direction in FIG. 4) is made larger than the diameter of the grain filter 52 (for example, approximately 200 nm or greater), and the length in the channel longitudinal direction (the L direction in FIG. 4) is set so as to be larger than the gate electrode formed in a later process. In the vicinity of the grain filter 52, fine crystal grain boundaries extending toward the periphery may appear, but the effect of these crystal grain boundaries can be excluded.

Figure 5:
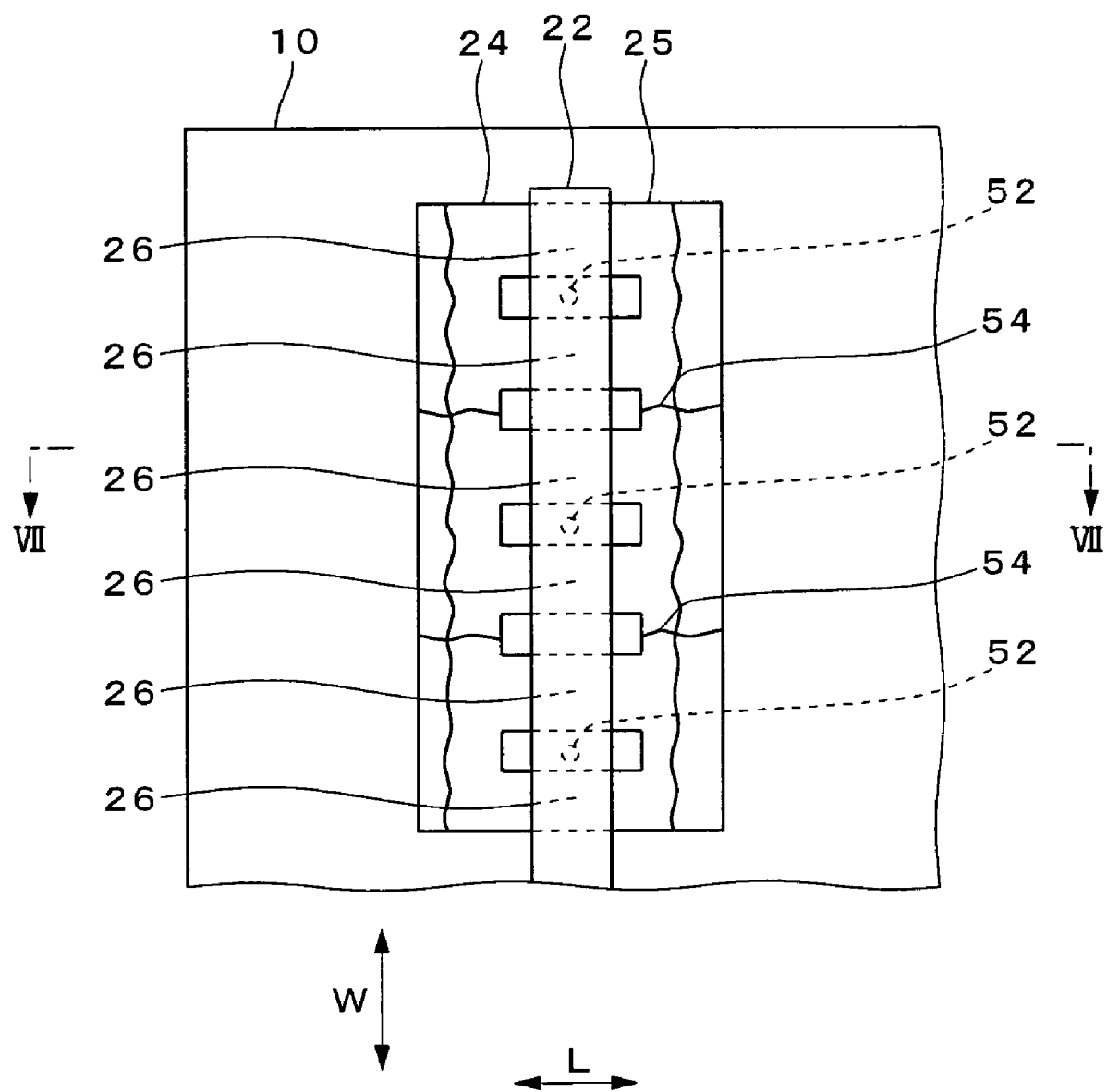
FIG. 5 is a plane view showing a thin film transistor formed using the transistor region shown in FIG. 4, focusing mainly on the gate electrode and active region (source region, drain region, channel formation region), and omitting other components.

FIG. 5 is a plane view showing a thin film transistor formed using the transistor region 18 shown in FIG. 4, focusing mainly on the gate electrode and active region (source region, drain region, channel formation region), and omitting other components. As shown in FIG. 5, in the thin film transistor T of this aspect, a plurality of channel formation regions 26 are formed using a plurality of silicon crystal grains 16a. By this means, crystal grain boundaries 54 existing in the channel longitudinal direction (the L direction in FIG. 5) can be excluded from the channel formation regions 26, and moreover a large effective channel width can be secured. Hence channel formation regions are formed using substantially single-crystal silicon film, and moreover a thin film transistor T with large channel width, that is, a thin film transistor with comparatively large output current and good charge mobility and other characteristics can be realized.

It is preferable that both removal of silicon film in the prescribed regions 56 containing crystal grain boundaries 54 and removal of silicon film in the prescribed regions 58 containing grain filters 52 be performed, but advantageous results are obtained from the independent performance of each.

The effect of crystal grain boundaries 54 can also be reduced by forming the gate electrode (gate film) such that the direction of extension of the crystal grain boundaries 54 and the longitudinal direction of the channel formation region (channel longitudinal direction) are substantially parallel. FIG. 6 is a drawing which explains the shape of a transistor region in this case. As shown in the drawing, the transistor region 18 and gate electrode 22 are positioned such that at least the channel longitudinal direction of the channel formation region (in this example, the region immediately beneath the gate electrode 22) and the direction of extension of crystal grain boundaries 54 contained in the channel formation region are substantially parallel. By this means, the direction of carrier flow (current direction) in the channel formation region and the direction of extension of crystal grain boundaries 54 are substantially parallel, so that carriers (electrons or holes) are not readily affected by crystal grain boundaries 54. It is suitable to combine this method with the above-described method of removing silicon film in the vicinity of grain filters 52.

Next, the process to form the thin film transistor T shown in FIG. 5 is explained. FIG. 7 is explanatory drawings which explain processes to form the thin film transistor T. The figures show cross-sections in the VII—VII direction in FIG. 5. The thin film transistor shown in FIG. 6 can also be fabricated by a method similar to that indicated below. In this case, FIG. 7 corresponds to cross-sectional views in the VII—VII direction shown in FIG. 6.

Figure 7A:
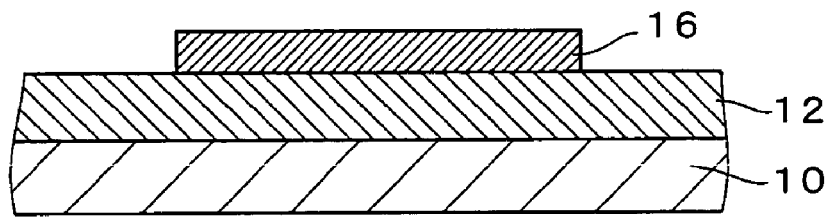
FIG. 7A through FIG. 7D are explanatory drawings which explain the process of forming a thin film transistor.

As shown in FIG. 7A, the silicon film 16 is patterned and shaped to remove portions which are unnecessary to formation of the thin film transistor T. At this time, as described above, prescribed ranges of the silicon film containing crystal grain boundaries 54 in the channel formation region 26 and prescribed ranges containing grain filters 52 and the vicinity thereof in which crystallinity is easily disordered are removed (see FIG. 5).

Figure 7B:
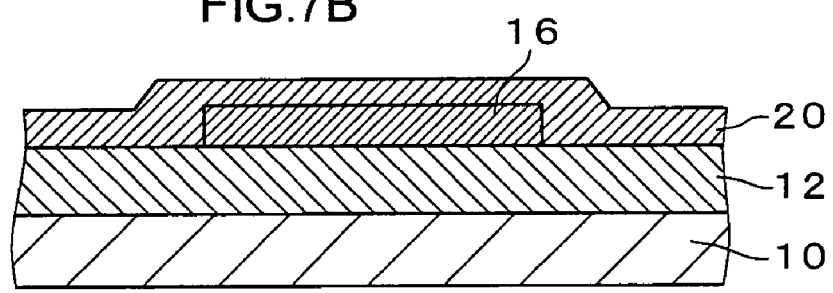

Next, as shown in FIG. 7B, silicon oxide film 20 is formed, by the electron cyclotron resonance PECVD (ECR- PECVD) method or by the parallel-plate PECVD method or similar, on the upper surface of the silicon oxide film 12 and silicon film 16. This silicon oxide film 20 functions as a gate insulating film for the thin film transistor, and preferably has a thickness of approximately 30 nm to 150 nm.

Figure 7C:
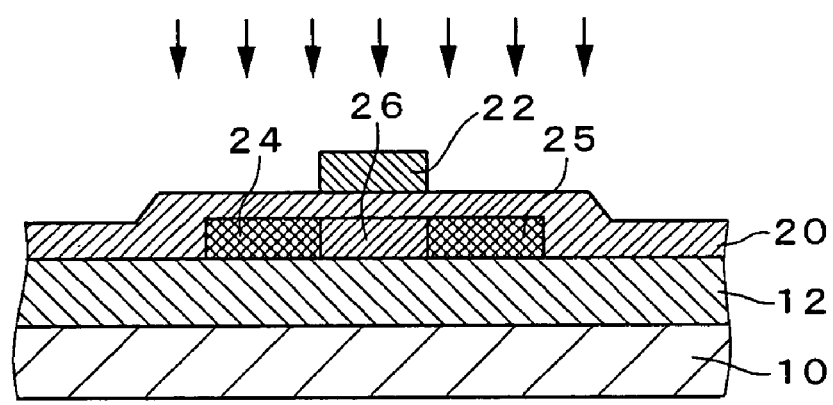

Next, as shown in FIG. 7C, after forming a tantalum, aluminum or other metal thin film by sputtering or another film fabrication method, patterning is performed to form a gate electrode 22 and gate wiring film. This gate electrode 22 is then used as a mask for the implantation of an impurity element as donors or acceptors, in so-called self-alignment ion implantation, in order to form a source region 24, drain region 25, and channel formation region 26 in the silicon film 16. For example, in this aspect phosphorus (P) is implanted as the impurity element, and then an XeCl excimer laser is adjusted to an energy density of approximately 200 mJ/cm$^2$ to 400 mJ/cm$^2$, and irradiation performed to activate the impurity element, thereby forming an N-type thin film transistor. In place of laser irradiation, heat treatment may be performed at a temperature of approximately 250° C. to 400° C. to activate the impurity element.

Figure 7D:
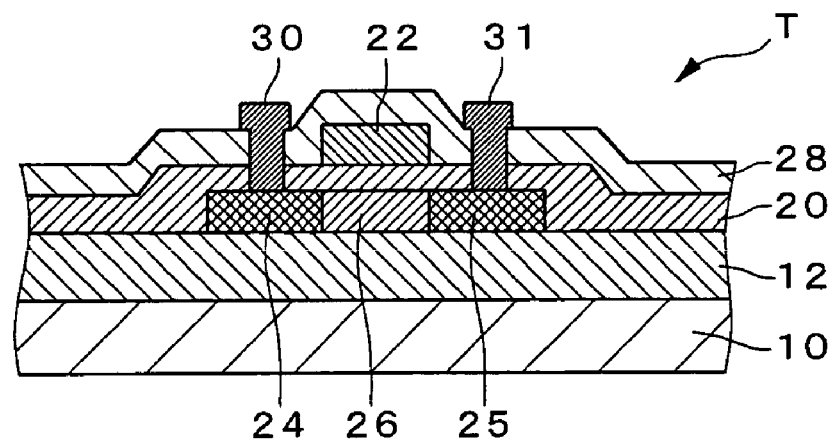

Next, as shown in FIG. 7D, PECVD or another film fabrication method is used to form silicon oxide film 28 to a thickness of approximately 500 nm on the upper surface of the silicon oxide film 20 and gate electrode 22. Then, two contact holes penetrating the silicon oxide films 20, 28 and reaching the source region 24 and drain region 25 respectively are formed, and by filling the interiors of these contact holes with aluminum, tungsten or another metal by sputtering or another film fabrication method and then patterning, the source electrode 30 and drain electrode 31 are formed. By means of the manufacturing method described above, the thin film transistor T of this aspect is formed.

Thus in this aspect, by removing silicon film in regions containing crystal grain boundaries 54 (boundary regions) existing in the channel longitudinal direction when patterning the silicon film 16, the inclusion of crystal grain boundaries in the channel formation region can be avoided and a channel formation region can be formed using substantially single-crystal good-quality silicon film. Consequently even when the channel width is made large, the effect of crystal grain boundaries is small and a thin film transistor with satisfactory characteristics can be obtained. Also, silicon film is removed in regions of grain filters 52 and the vicinity thereof, so that the inclusion in the channel formation region 26 of silicon film with degraded crystallinity can be avoided, and the characteristics of the thin film transistor can be further improved.

Next, an example of application of a thin film transistor of this invention is explained. A thin film transistor of this invention can be used as a switching element in a liquid crystal display device, or as a driving element in an organic EL display device.

Figure 8:
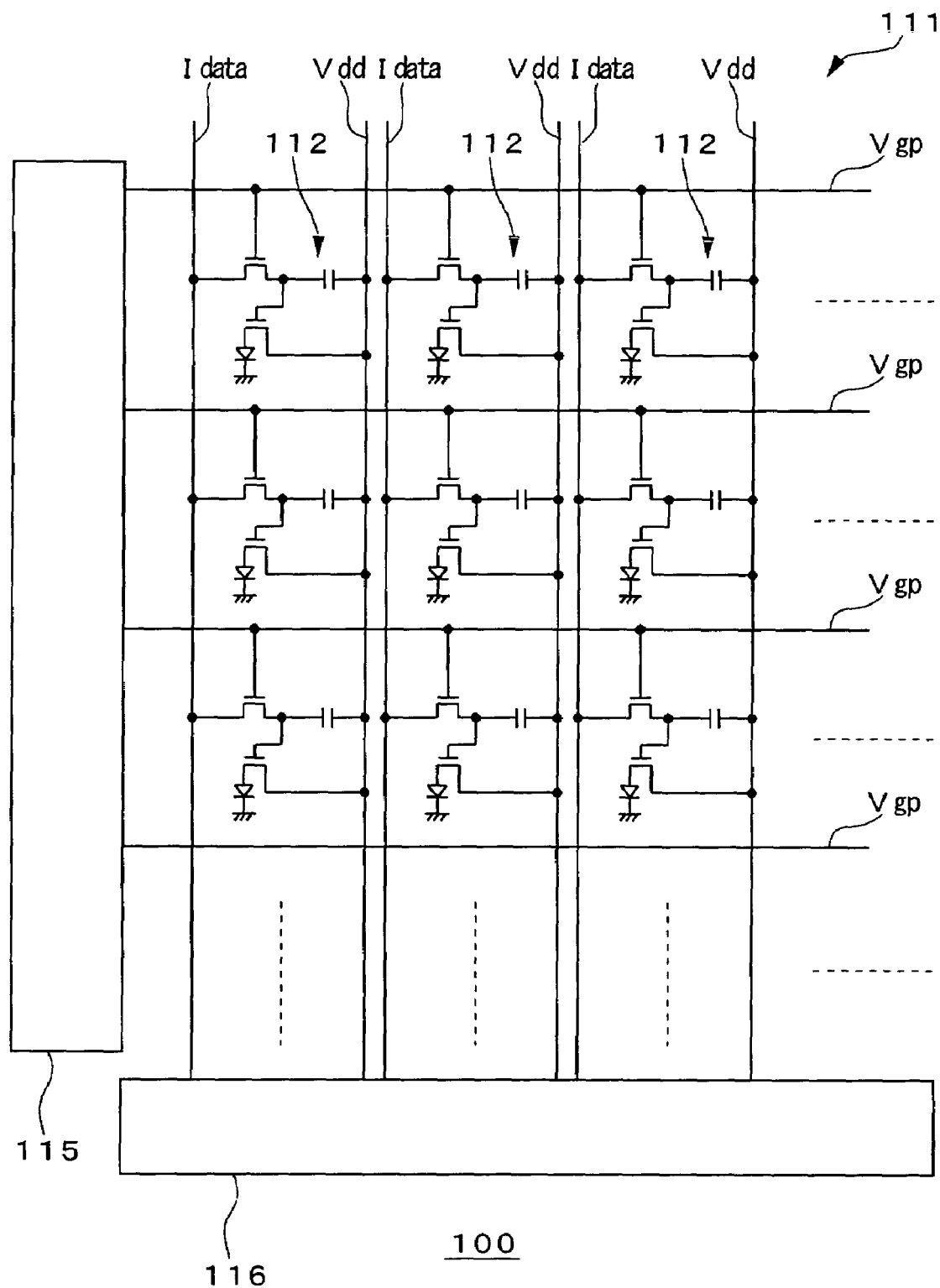
FIG. 8 is a drawing showing the connection state of a display device which is one example of an electro-optical device; and, FIG. 9A through FIG. 9D are drawings which show examples of electronic equipment to which a display device can be applied.

FIG. 8 is a drawing showing the connection state of a display device 100 which is one example of an electro-optical device of this aspect. As shown in FIG. 8, the display device 100 is configured with the pixel regions 112 positioned within the display region 111. In pixel regions 112, a thin film transistor which drives an organic EL emission element is used. The thin film transistor used is manufactured by the manufacturing method of the above aspect. An emission control line (Vgp) and write control line are supplied to each pixel region from the driver region 115; a current line (Idata) and power supply line (Vdd) are supplied to each pixel region from the driver region 116. By controlling the write control line and constant-current line Idata, current programming of each pixel region is performed, and by controlling the emission control line Vgp, light emission is controlled. The thin film transistor of this aspect can also be used in the driver regions 115 and 116, and are particularly useful is applications requiring large currents, such as the emission control lines and buffer circuitry to select write control lines comprised by the driver region 115.

FIG. 9 are drawings showing examples of electronic equipment to which the display device 100 can be applied. The above-described display device 100 can be applied to various electronic equipment.

FIG. 9A is an example of application to a portable telephone; the portable telephone 230 comprises an antenna portion 231, an audio output portion 232, an audio input portion 233, an operation portion 243, and a display device 100 of this invention. Thus a display device of this invention can be used as a display portion.

FIG. 9B is an example of application to a camcorder; the camcorder 240 comprises an image pickup portion 241, an operation portion 242, an audio input portion 243, and a display device 100 of this invention. Thus a display device of this invention can be used as a viewfinder and display portion.

FIG. 9C is an example of application to a portable personal computer (a so-called PDA); the computer 250 comprises a camera portion 251, an operation portion 252, and a display device 100 of this invention. Thus a display device of this invention can be used as a display portion.

FIG. 9D is an example of application to a head-mounted display; the head-mounted display 260 comprises a band 261, an optical housing portion 262, and a display device 100 of this invention. Thus a display panel of this invention can be used as an image display source.

FIG. 9E is an example of application to a rear projector; the projector 270 comprises a chassis 271, light source 272, composite optical system 273, mirrors 274 and 275, screen 276, and a display device 100 of this invention. Thus a display device of this invention can be used as an image display source.

FIG. 9F is an example of application to a front projector; the projector 280 comprises a chassis 282, optical system 281, and a display device 100 of this invention, and is capable of displaying an image on a screen 283. Thus a display device of this invention can be used as an image display source.

A display device 100 employing a transistor of this invention can, in addition to the above-described examples, be applied in any electronic equipment to which active-matrix or passive-matrix liquid crystal display devices or organic EL display devices can be applied. For example, in addition to the above examples, application in fax machines with display functions, the viewfinders of digital cameras, portable TV sets, electronic organizers, electro-optical announcement boards, and advertisement displays is also possible.

It is also possible to combine the semiconductor device manufacturing method of the above-described aspects with element transfer techniques. Specifically, the method of the above-described aspects is applied to form a semiconductor device on a first substrate which is to be the transfer source, and then the semiconductor device is transferred (moved) onto a second substrate which becomes the transfer destination. By this means, a first substrate can be used which offers conditions (shape, size, physical characteristics, and similar) favorable for deposition of the semiconductor film and for the subsequent device formation, so that a minute high-performance semiconductor device can be formed on the first substrate. The second substrate can be made large, without being constrained by the element formation processes, and can employ the desired material among a wide variety of possible materials, such as synthetic resins, soda glass and other inexpensive substrate materials, as well as pliable plastic film or similar. Hence a minute high-performance thin film semiconductor element can be formed easily (inexpensively) on large-area substrate.

What is claimed is:

1. A semiconductor device manufacturing method, the method comprising:

forming a plurality of starting-point portions on a substrate;

forming a first semiconductor film on the substrate on which the starting-point portions have been formed;

forming a second semiconductor film by a heat treatment of the first semiconductor film, the second semiconductor film having a plurality of substantially single-crystal grains each of which is substantially centered on one of the plurality of starting-point portions;

forming a plurality of transistor regions which are to become source and drain regions and a channel formation region of a transistor; and forming a gate insulating film and a gate electrode on the transistor regions, the forming of the transistor regions including removing the second semiconductor film in a region including boundaries between the substantially single-crystal grains which exist in the longitudinal direction of the channel formation region.

2. The semiconductor device manufacturing method according to claim 1, wherein the forming of the transistor regions further includes removing the second semiconductor film from a region including at least either the plurality of starting-point portions or the vicinity thereof of the substantially single-crystal grains.

3. The semiconductor device manufacturing method according to claim 1, the plurality of starting-point portions being depressions formed in the substrate.

4. The semiconductor device manufacturing method according to claim 3, the heat treatment being performed under conditions such that the first semiconductor film is in the unmelted state in the depressions while other portions are melted.

5. The semiconductor device manufacturing method according to claim 1, the heat treatment being performed by a laser irradiation.

6. The semiconductor device manufacturing method according to claim 1, the first semiconductor film being amorphous or polycrystalline silicon film.

7. A semiconductor device manufacturing method, the method comprising:

forming a plurality of starting-point portions on a substrate;

forming a first semiconductor film on the substrate on which the plurality of starting-point portions have been formed;

forming a second semiconductor film by a heat treatment of the first semiconductor film, the second semiconductor film having a plurality of substantially single-crystal grains each of which is substantially centered on one of the plurality of starting-point portions;

forming a plurality of transistor regions which are to become source and drain regions and a channel formation region of a transistor; and forming a gate insulating film and a gate electrode on the transistor regions to form the transistor, the forming of the transistor regions including removing the second semiconductor film in a region including at least either the plurality of starting-point portions or the vicinity thereof of the substantially single-crystal grains, and including forming the transistor regions such that the direction of extension of the boundaries between the substantially single-crystal grains and a longitudinal direction of a channel formation region are substantially parallel.

8. A semiconductor device manufacturing method, the method comprising:

forming a plurality of starting-point portions on the substrate;

forming a first semiconductor film on the substrate on which the plurality of starting-point portions have been formed;

forming a second semiconductor film by a heat treatment of the first semiconductor film, the second semiconductor film having a plurality of substantially single-crystal grains each of which is substantially centered on one of the plurality of starting-point portions;

forming a plurality of transistor regions which are to become source and drain regions and a channel formation region of a transistor; and forming a gate insulating film and a gate electrode on the transistor regions, the forming of the gate insulating film and the gate electrode including forming the gate electrode such that the direction of extension of the boundaries between the substantially single-crystal grains and a longitudinal direction of the channel formation region are substantially parallel.

9. The semiconductor device manufacturing method according to claim 8, wherein the forming of the transistor regions further includes removing the second semiconductor film from a region including at least either said plurality of starting-point portions or the vicinity thereof of the substantially single-crystal grains.

* * * * *